United States Patent [19]

Schlesinger

[11] 4,138,612
[45] Feb. 6, 1979

[54] CIRCUIT HAVING ADJUSTABLE CLIPPING LEVEL

[75] Inventor: Eugene R. Schlesinger, Wilton, Conn.

[73] Assignee: The Perkin-Elmer Corporation, Norwalk, Conn.

[21] Appl. No.: 832,155

[22] Filed: Sep. 12, 1977

[51] Int. Cl.² ............................ H03K 5/08; H03K 1/14
[52] U.S. Cl. ..................................... 307/237; 307/318; 328/171; 330/110; 330/145; 330/284
[58] Field of Search ................ 307/237, 318; 328/168, 328/169, 171–173, 175; 330/110, 145

[56] References Cited

U.S. PATENT DOCUMENTS 3,404,348   10/1968   Hansen et al. .................. 328/171 X Primary Examiner—John Zazworsky
Attorney, Agent, or Firm—Salvatore A. Giarratana; Francis L. Masselle; John D. Crane

[57] ABSTRACT

A circuit for selecting a clipping level including a passive clipping element having a transfer function like that of either a zener diode, two series connected opposing zener diodes or other passive clipping elements. An inverting operational amplifier with a selectable gain couples to the passive clipping element and by adjusting the amplifier gain, the clipping level can be selectively reduced to almost zero from that of the clipping level for the passive clipping element itself.

11 Claims, 6 Drawing Figures

$$E_o \leq \left| \frac{V_f + V_z}{1 + \frac{R2 R5}{R3 Rx}} \right|$$

CIRCUIT HAVING ADJUSTABLE CLIPPING LEVEL

BACKGROUND OF THE INVENTION

The present invention relates generally to clipping circuits and more particularly to clipping circuits which can be adjusted between a maximum level determined by a passive clipping element and a minimum which approaches zero.

Clipping circuits have long been used in the electronics industry for preventing a signal level from exceeding a given upper level. Some such known circuits clip signals of a single polarity, i.e., either positive or negative, while other circuits are known for clipping signals having levels above a given level for both polarities. In addition, other clipping circuits have been developed which are not necessarily symmetric about zero volts, i.e., the clipping level might be, for example, above plus 6 volts and below plus 1 volt.

The limitation of these prior art clipping circuits, however, is that the clipping level is generally a function of the passive clipping element in the circuit itself (such as a zener diode) which does not have an adjustable clipping level. In addition, with respect to passive clipping elements such as zener diodes, the minimum clipping level is typically in the order of 1.8 volts. In order to obtain a lower clipping voltage such as around 0.5 volts, one can utilize the forward breakdown characteristics of a device such as single junction reference diode such as those manufactured by the Codi Corp. In either case, however, the clipping voltage cannot be adjusted lower than that for the passive clipping element thereby making it impossible to produce a simple clipping circuit having a clipping level compatible with high gain low signal level operational amplifiers and the like. In addition, without elaborate electronics, clipping circuits have not heretofore been easily designed having a desired clipping level especially when the desired clipping level is below approximately one-half volt.

In view of the foregoing difficulties with known clipping circuits, it is the principal objective of the present invention to provide a clipping circuit permitting adjustment of a clipping level between a maximum determined by a passive clipping element and a minimum which approaches zero.

It is a further objective of the invention to provide a clipping circuit with an adjustable clipping level which may be adjusted to almost zero volts wherein the circuit may provide symmetrical clipping.

It is still a further objective of the invention to provide an adjustable clipping circuit wherein the clipping levels and their symmetry are both adjustable.

BRIEF DESCRIPTION OF THE INVENTION

The clipping circuit according to the present invention utilizes a passive clipping element such as a pair of series connected opposing zener diodes or the like. An inverting amplifier is coupled across the passive clipping element and, by adjusting the gain thereof, the clipping level of the passive clipping element and amplifier configuration is adjusted.

In an alternative embodiment of the present invention, the inverting amplifier is constructed of two operational amplifier stages with one stage being a non-inverting amplifier stage and the second stage being a unity gain inverter stage. In this configuration, the circuit includes circuit elements to compensate for stray capacitance in the passive clipping element. In a further alternative embodiment of the invention, an adjustable power supply is associated with the inverting amplifier and, by adjusting this supply, the symmetry level of the composite clipping circuit can be adjusted either upwardly or downwardly.

BRIEF DESCRIPTION OF THE DRAWINGS

The foregoing objects, advantages and features of the invention are described below in even greater detail in connection with the drawings wherein.

DETAILED DESCRIPTION

Figure 1:
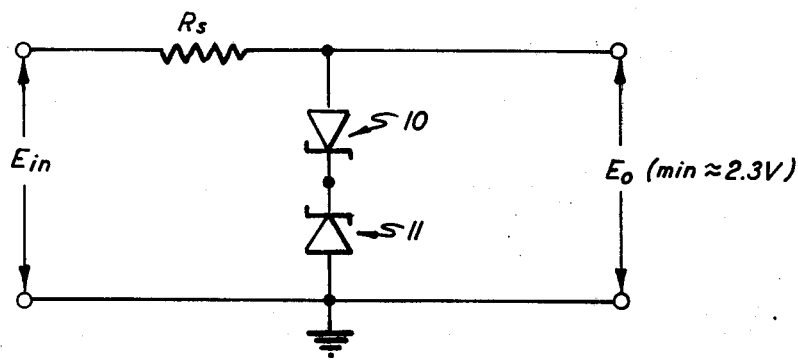
FIG. 1 shows a typical prior art passive clipping circuit using two series connected opposing zener diodes.

Clipping circuits are generally well-known in the prior art and one such clipping circuit is shown in FIG. 1. This circuit has an input designated as $E_{in}$ and an output designated as $E_o$. A series resistor $R_s$ is disposed between the input and the output terminal. The circuit additionally includes two series connected opposing zener diodes 10 and 11. The transfer function for the circuit of FIG. 1 has an output voltage $E_o$ which is identical to its input so long as the input voltage in amplitude is below the breakdown voltage of one of the zener diodes 10 and 11 plus the forward voltage of the other zener diode 11 and 10. Where the zener diodes 10 and 11 are selected as being a National Semiconductor LM103-1.8, the output voltage of the circuit in FIG. 1 ranges between approximately −2.6 volts and +2.6 volts. If other zener diodes are selected, the clipping level is different and corresponds to the sum of the forward and reverse voltages associated with the selected zener diodes.

Figure 2:
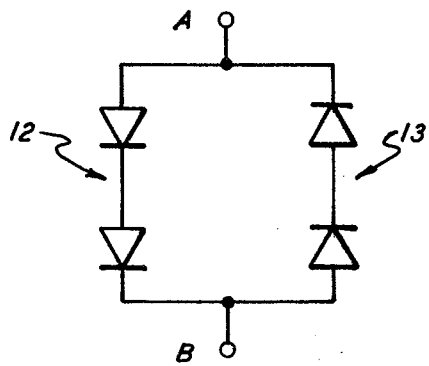
FIG. 2 shows a prior art passive clipping circuit using diodes but having a transfer function very similar to that of the circuit of FIG. 1.

FIG. 2 shows yet another prior art passive clipping element utilizing pairs of series connected diodes indicated generally at 12 and 13 which themselves are connected in parallel to form the passive clipping element. The series connected diode devices can be purchased from the Codi Corp. and are known as a multi-junction reference diodes. They may also be constructed of individual diodes, however, such diodes are difficult to match and, consequently, the clipping produced by such a device may not have the same clipping level in both the positive and the negative direction. In any event, the clipping level of such circuit is dependent entirely on the diodes in the network itself.

Figure 3:
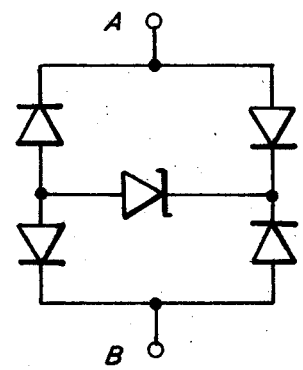
FIG. 3 shows yet another prior art passive clipping circuit.

A further prior art passive clipping element is shown in FIG. 3 which comprises a symmetrical limiter. This circuit provides symmetrical clipping and is likely to be less expensive then the circuit of FIG. 1 because only one zener diode is utilized in combination with four diodes which is less expensive than two zener diodes as shown in FIG. 1. As pointed out above, however, each of the circuits of FIG. 1–3 has a clipping level which is a direct function of the passive clipping element in the network.

Figure 4:
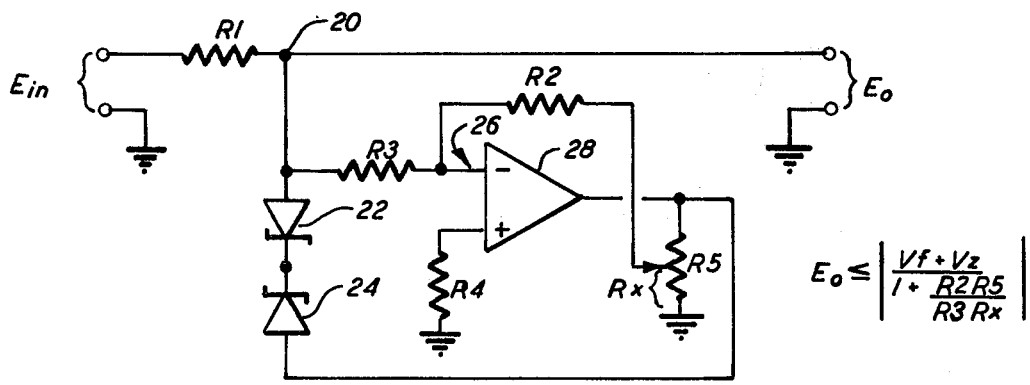
FIG. 4 shows a schematic diagram for one embodiment for the present invention.

Referring now to FIG. 4, one embodiment of the present invention is shown. This embodiment is described in greater detail in the magazine entitled "Electronic Design" volume 9 page 118, Apr. 26, 1977. The content of that article is herein incorporated by reference.

As seen in FIG. 4, the input voltage is applied across the terminals labeled $E_{in}$ which coupled to the output terminals labeled $E_o$ via a resistor R1. Connected to point 20 are two series connected opposing zener diodes 22 and 24. Also coupled to point 20 is a resistor R3 whose other lead is connected to the inverting input 26 of an operational amplifier 28. The output of the operational amplifier 28 couples to the potentiometer R5 as well as to the zener diode 24. The tap of the potentiometer R5 couples via the resistor R2 back to the inverting input terminal 26. The non-inverting input to the operational amplifier 28 is coupled by way of a resistor R4 to ground. As indicated in the above-referenced article discussing the operation of the circuitry of FIG. 4, by adjusting the gain of the amplifier 28, the clipping level at point 20 can be adjusted to be lower than that provided by the zener diodes 22 and 24 alone. Indeed, it will be recognized from the equation shown for the output voltage in FIG. 4 where $V_f$ and $V_z$ are the forward and the zener voltages for the zener diodes 22 and 24 that the greater the gain of the amplifier 28, the smaller the clipping level that is achieved by the circuit for the voltage appearing at point 20.

The circuit according to FIG. 4 operates basically in the following manner. The voltage applied at point 20 is amplified by the operational amplifier 28 circuit including the resistors coupled thereto thereby producing a much greater voltage across the two zener diodes 22 and 24 than appears at the point 20. When the input voltage appearing at point 20 is equal to the voltage defined by the equation in FIG. 4, the zener diodes 22 and 24 will conduct thereby preventing further increase in the voltage at point 20. Accordingly, the voltage appearing at point 20 is clipped at a level below the clipping level for the passive clipping elements 22 and 24 alone and at a level determined primarily by the gain of the inverting amplifier circuit including operational amplifier 28 and the resistors coupled thereto.

Figure 5:
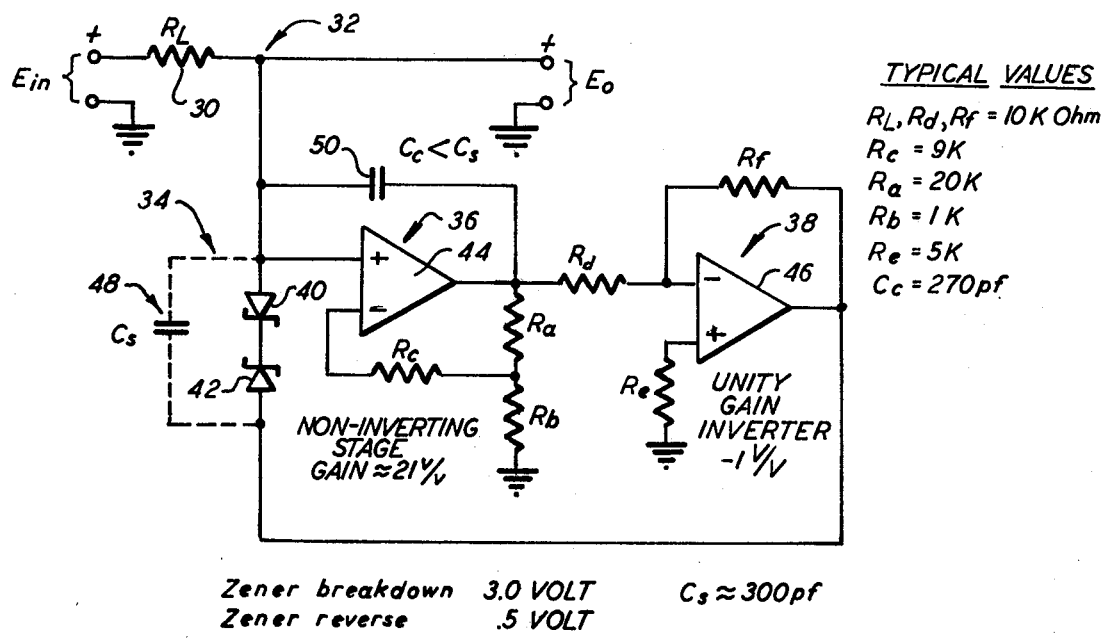
FIG. 5 is a schematic diagram for an alternative embodiment of the present invention.

Referring now to FIG. 5, an alternative clipping circuit according to the present invention is shown. In this embodiment, the input signal is applied at the terminals indicated as $E_{in}$ and the output appears at the terminal indicated as $E_o$. A series resistor 30 is disposed between the input and the output terminals. The clipping circuit according to the invention is coupled to the output terminal $E_o$ at the point indicated generally at 32. The clipping circuit according to the invention includes a passive clipping element indicated generally at 34, a non-inverting amplifier shown at 36 and a unity gain inverter shown at 38.

The passive clipping element 34 comprises two series connected opposing zener diodes 40 and 42. One lead of the zener diode 40 couples to point 32 while one lead of the zener diode 42 couples to the output of the unity gain inverter 38. Other passive clipping elements may be used in place of zener diodes 40 and 42.

The point 32 is also coupled to the non-inverting input of an operational amplifier 44 whose output is coupled by a resistor network including resistors $R_a$, $R_b$ and $R_c$ to its inverting input. In this configuration, the operational amplifier 44 and its associated resistors comprise a non-inverting amplifier stage whose gain is calculated in a conventional manner and, for the typical values indicated in FIG. 5, the gain is approximately 21.

The output of operational amplifier 44 couples by a resistor $R_d$ to a further operational amplifier 46 whose output is coupled by a feedback resistor $R_f$ to its inverting input. A further resistor $R_e$ couples between the non-inverting input of operational amplifier 46 and ground. For the configuration of the resistors coupled to the operational amplifier 46 with the typical values indicated in FIG. 5, the inverter has a gain of one, i.e., the stage comprises a unity gain inverter.

When operated at high frequencies, the circuit in FIG. 5 can be adversely affected by the stray capacitance of the zener diodes indicated in dotted lines at 48. The stray capacitance ($C_s$) 48 in combination with the resistor $R_L$ comprises a RC network which will reduce the amplitude of $E_o$ due to any high frequency signal appearing at the input terminals $E_{in}$. To compensate for this, the circuit of FIG. 5 includes a capacitance compensator arrangement including a compensating capacitor ($C_c$) 50 which comprises a capacitance smaller than the stray capacitance of the zener diodes 40 and 42. The compensating capacitor 50 is coupled between the output of operational amplifier 44 and its non-inverting input.

For the typical values indicated in FIG. 5, the output voltage appearing at the output terminals $E_o$ is between plus and minus 0.167 volts. However, by changing the values of the resistors $R_a$, $R_b$ and $R_c$, the non-inverting stage gain can be adjusted to be, for example, 34. For such a circuit, the clipping level at the output terminals $E_o$ is between plus and minus 0.1 volts.

Figure 6:
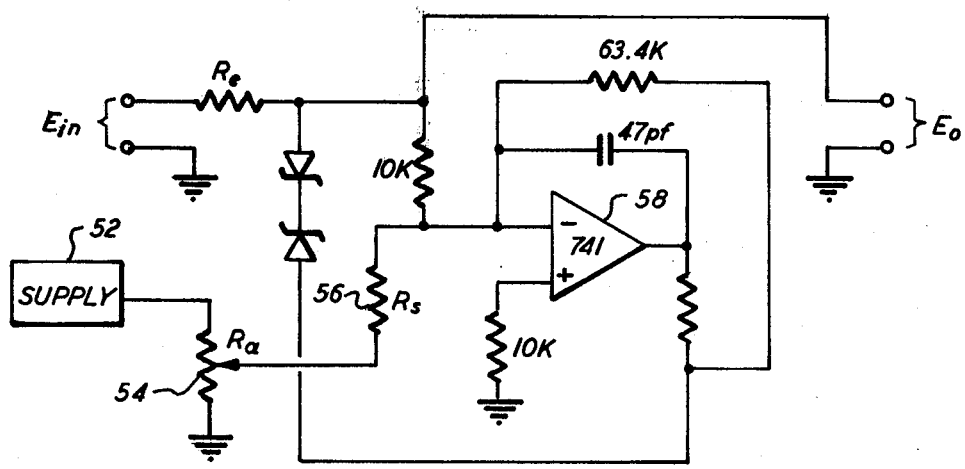
FIG. 6 shows yet a third schematic of still a third embodiment of the invention which includes means to adjust the symmetry point of the clipping circuit.

FIG. 6 shows a typical configuration of the present invention utilizing a single operational amplifier stage. This circuit, however, is further modified by having a power supply 52 whose output is coupled to ground by way of a potentiometer 54. The wiper of the potentiometer 54 couples by way of a series resistor 56 to the inverting input of the operational amplifier 58. By adjusting the wiper of the potentiometer 54, a voltage is injected into the inverting input of the operational amplifier 58. This will cause a shift in the symmetry point about which clipping occurs. For example, without the supply 52, potentiometer 54 and the resistor 56, the circuitry of 56 would have a clipping level determined by the gain of the amplifier at the same level regardless of input voltage polarity. When the supply 52 injects a negative voltage into the inverting input of operational amplifier 58, however, the symmetry point is shifted in the positive direction so that the upper clipping level of the circuit is raised as is the lower clipping level. The mid-point between the two clipping levels, however, is no longer zero but some positive value.

A further modification of the invention is to remove one of the zener diodes in the passive clipping element portion of each of the circuits shown in FIGS. 4-6. By doing such, the circuit will provide a clipping level for one polarity signal at the input but will not provide clipping for the other polarity. For example, if zener diode 40 in FIG. 5 were removed, the circuit would provide a positive clipping level of approximately 0.136 volts and a lower level of about 0 volts.

While the foregoing description has emphasized several embodiments of the invention as shown in the drawings, those of skill in the art will readily recognize that numerous modifications may be made to the circuitry shown in the drawings, other than those already outlined, without departing from the spirit and scope of the invention as defined below in the claims. For example, in place of series connected opposing zener diodes as the passive clipping element in each of the circuits described above, ordinary diodes with bucking floating power supplies or batteries can be utilized in place thereof to produce a passive clipping element having a transfer function essentially identical to that of the replaced zener diodes. In addition, other active circuits may be utilized in place of the zener diodes so long as the transfer function of the active device is essentially the same as the replaced zener diodes. In that sense, the active circuit operates as a passive clipping element and the term passive clipping element, when utilized in the claims, is intended to encompass such active networks.

What is claimed is:

1. An adjustable clipping circuit for adjustably reducing the clipping level of a passive clipping element comprising, in combination:
   an input terminal adapted to be coupled to an external circuit;
   a passive clipping element with two terminals for clipping the voltage appearing thereacross, one said clipping element terminal being coupled to said input terminal, said clipping element being conductive in two directions; and
   an adjustable gain inverting amplifier with an input and an output, said input being coupled to said input terminal and said output being coupled to said clipping element terminal not coupled to said input terminal, the clipping level being adjustable by controlling the gain of said inverting amplifier.

2. The clipping circuit of claim 1 wherein said inverting amplifier includes symmetry adjusting means to adjust the symmetry point for the signal appearing a said input terminal.

3. The clipping circuit of claim 1 wherein said clipping element has the transfer function of two series connected opposing zener diodes.

4. The clipping circuit of claim 1 wherein said clipping element has the transfer function of a zener diode.

5. The clipping circuit of claim 1 wherein said adjustable gain inverting amplifier includes a non-inverting stage and an inverting stage.

6. An adjustable clipping circuit for adjustably reducing the clipping level of a passive clipping element comprising, in combination:
   a passive clipping element with two terminals, one said terminal adapted to being connected to an external circuit, said clipping element being conductive in two directions;
   a coupling resistor and an adjustable feedback resistor; and
   an operational amplifier circuit with an inverting input, a non-inverting input and an output, said inverting input being coupled to a reference voltage and also coupled by said coupling resistor to said one terminal of said passive clipping element, said output being coupled by said feedback resistor to said inverting input as well as being coupled to the other terminal of said passive clipping element, the resistance of said feedback resistor and said coupling resistor controlling the amplifier gain and, therefore, the clipping level for the circuit coupled to said one terminal.

7. The circuit of claim 6 wherein said passive clipping element comprises at least one zener diode.

8. The circuit of claim 6 wherein said passive clipping element comprises two opposing series connected zener diodes.

9. The circuit of claim 6 wherein said passive clipping element has a transfer function of a zener diode.

10. The circuit of claim 6 wherein said passive clipping element has a transfer function of a pair of opposing series connected zener diodes.

11. An adjustable clipping circuit for reducing the clipping level of a passive clipping element comprising, in combination:
    a clipping element with two terminals and a stray capacitance, one said terminal adapted to being connected to an external circuit, said clipping element being conductive in two directions;
    a first operational amplifier configured to amplify the signal appearing at said one terminal, said first operational amplifier having a preselected gain;
    a capacitor with less capacitance than the stray capacitance of said clipping element coupled from the output of said first operational amplifier to said one terminal; and
    a second operational amplifier configured as an inverting unity gain amplifier and coupled between said first operational amplifier output and the other terminal of said clipping element wherein the clipping level of the signal coupled to said one terminal is not greater than the clipping level of said clipping element but selectively smaller as a function of the selected gain for said first operational amplifier.

* * * * *